United States Patent
Imamiya

[11] Patent Number: 5,812,001
[45] Date of Patent: Sep. 22, 1998

[54] POWER-ON RESET CIRCUIT FOR RESETTING SEMICONDUCTOR INTEGRATED CIRCUIT

[75] Inventor: Keniti Imamiya, Kawasaki, Japan

[73] Assignee: Kabushiki Kaisha Toshiba, Kawasaki, Japan

[21] Appl. No.: 609,911

[22] Filed: Feb. 29, 1996

[30] Foreign Application Priority Data

Mar. 2, 1995 [JP] Japan ................................. 7-042218

[51] Int. Cl.⁶ .............. H03K 17/22; G05F 1/10; G05F 3/02
[52] U.S. Cl. ................ 327/198; 327/143; 327/546
[58] Field of Search ............................ 327/198, 143, 327/142, 50, 545, 546

[56] References Cited

U.S. PATENT DOCUMENTS

| | | | |
|---|---|---|---|
| 5,017,803 | 5/1991 | Yoshida | 327/546 |
| 5,151,614 | 9/1992 | Yamazaki et al. | 327/143 |
| 5,469,402 | 11/1995 | Yamauchi et al. | 365/189.05 |
| 5,565,811 | 10/1996 | Park et al. | 327/143 |

FOREIGN PATENT DOCUMENTS 64-25618  1/1989  Japan ..................... 327/143

Primary Examiner—Timothy P. Calahan
Assistant Examiner—Terry L. Englund
Attorney, Agent, or Firm—Banner & Witcoff, Ltd.

[57] ABSTRACT

First and second inverter circuits each include a P channel and an N channel MOS transistor whose current paths are connected in series between a power-supply and ground. An input terminal of the second inverter circuit is connected to an output terminal of the first inverter circuit. A first capacitor is connected between the output terminal of the second inverter circuit and the power supply. A second capacitor is connected between the output terminal of the first inverter circuit and ground. A third capacitor is connected between the output terminal of the second inverter circuit and the input terminal of the first inverter. A fourth capacitor is connected between the input terminal of the first inverter circuit and ground. When an output voltage of the first inverter circuit is in a low level state at time of the rise of the power supply and a charging voltage of the third capacitor reaches a threshold voltage of the P channel MOS transistor of the first inverter circuit, an output voltage of the first inverter circuit is set to a high level to charge the second capacitor. When an output voltage of the second inverter circuit rises in accordance with the power-supply voltage, and a charging voltage of the second capacitor reaches a threshold voltage of the N channel MOS transistor of the second inverter circuit, the output voltage of the second inverter circuit is set to a low level.

25 Claims, 3 Drawing Sheets

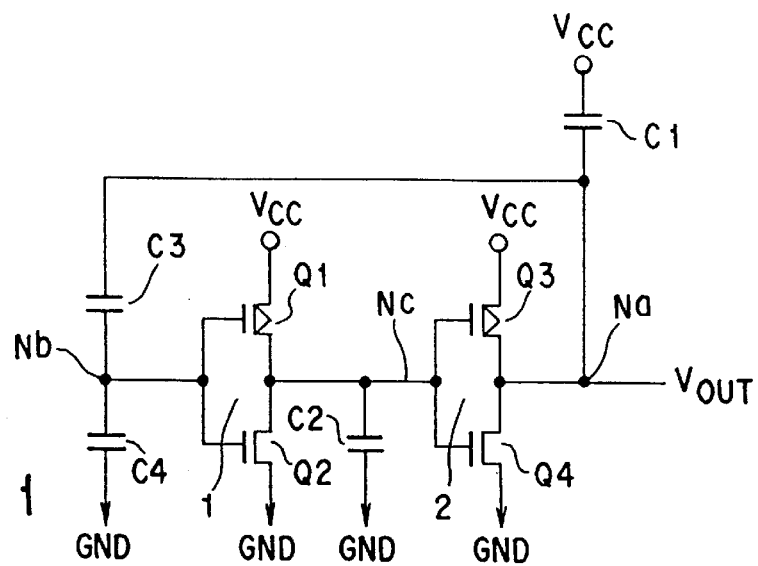
F I G. 1
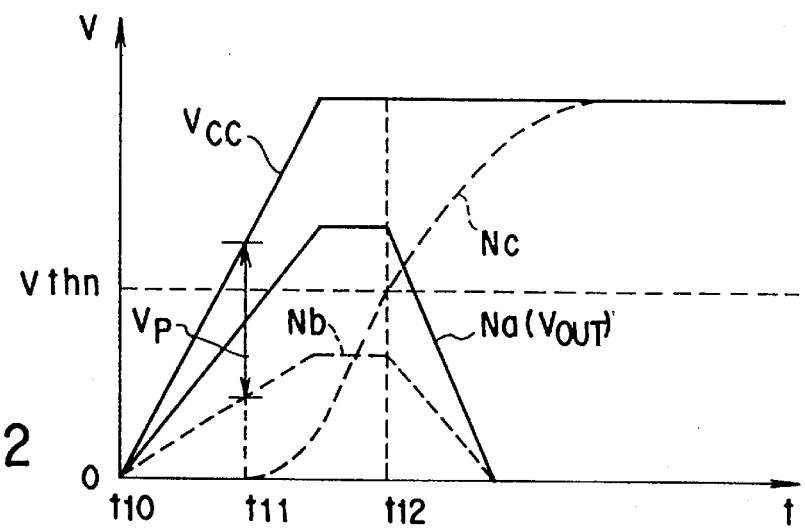
F I G. 2
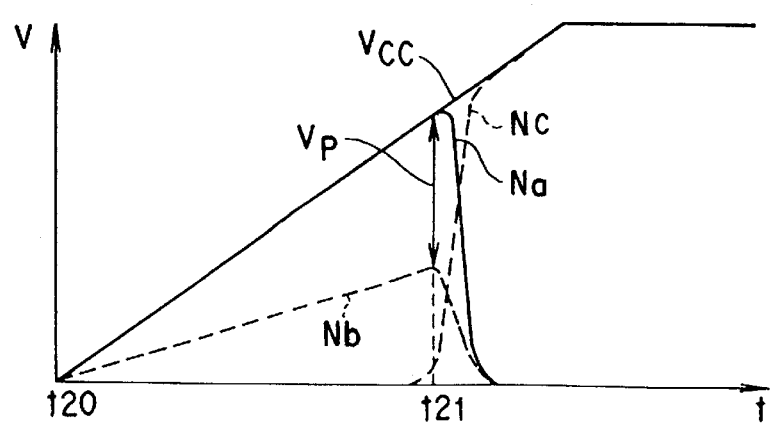
F I G. 3

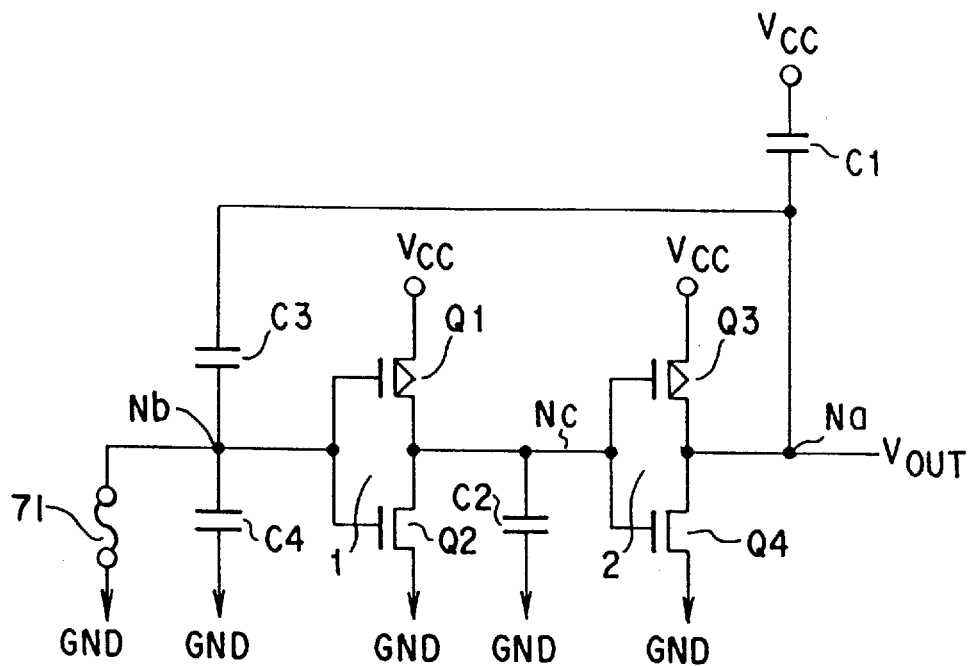
F I G. 7

POWER-ON RESET CIRCUIT FOR RESETTING SEMICONDUCTOR INTEGRATED CIRCUIT

BACKGROUND OF THE INVENTION

1. Field of the Invention

The present invention relates to a power-on reset circuit, which is applied to, e.g., a semiconductor device, for generating a pulse signal for resetting a semiconductor integrated circuit when power is supplied.

2. Description of the Related Art

In a semiconductor device such as a semiconductor memory, a power-on reset circuit is used. The power-on reset circuit generates a pulse signal for resetting an internal circuit of the semiconductor device in accordance with the rise of the power-supply voltage.

FIG. 8 shows a conventional power-on reset circuit used in a DRAM. In this circuit, a flip-flop circuit FF is formed by connecting input and output terminals of an inverter circuit 21 to output and input terminals of an inverter circuit 22. A P channel MOS transistor Q8 and a resistor element R3 are connected between a power-supply Vcc and a ground GND in series. A connection node between the P channel MOS transistor Q8 and the resistor element R3 is connected to one end N1 of the flip-flop circuit FF. A capacitor element C8 is connected between a gate of the MOS transistor Q8 and the ground GND. A resistor element R4 and an N channel transistor Q9 are connected between the power-supply Vcc and the ground GND. A connection node g between the resistor element R4 and the N channel MOS transistor Q9 is connected to the gate of the MOS transistor Q8.

A resistor element R2 and a P channel MOS. transistor Q7 are connected in parallel between the other end N2 of the flip-flop circuit FF and the power-supply Vcc. A resistor element R1 and a capacitor element C7 are connected in series between the power-supply Vcc and the ground GND. A connection node f between the resistor element R1 and the capacitor element C7 is connected to a gate of the MOS transistor Q7. An input terminal of a series circuit comprising inverter circuits 23 and 24 is connected to the other end N2 of the flip-flop circuit FF. An output voltage Vout, serving as a power-on reset pulse, is output through the inverter circuits 23 and 24.

An operation of the power-on reset circuit of FIG. 8 is as follows.

More specifically, if power is supplied, the other end N2 of the flip-flop circuit FF is set to a high level through the resistor R2. When the power-supply voltage Vcc rapidly rises, a potential of the connection node f between the resistor element R1 and the capacitor element C7 and a potential of the connection node g between the resistor element R4 and the MOS transistor Q9 rise from a ground potential GND to Vcc by a time constant determined by the resistor elements R1 and R4 and the capacitor elements C7 and C8. However, the potential of the node g does not rise more than a threshold voltage of the MOS transistor Q9 by the MOS transistor Q9. As a result, the MOS transistor Q8 is turned on, and the potential of one end N1 of the flip-flop circuit FF is set to a high level. Then, the flip-flop circuit FF is inverted, and the potential of the other end N2 changes from Vcc to GND. If power is supplied, the output voltage Vout gradually rises through a P channel MOS transistor (not shown) forming the inverter circuit 24. If the potential of the flip-flop circuit FF is inverted, the output voltage Vout also changes from Vcc to GND. In other words, an output of the power-on reset pulse is ended after the power-supply voltage Vcc reaches more than a predetermined voltage.

On the other hand, if the output voltage Vout slowly rises, the potential of the node f and that of the node g smoothly rise from GND to Vcc without being influenced by the capacitor elements C7 and C8. However, the rise of the potential of the node stops at the time when the power-supply voltage Vcc exceeds the threshold voltage of the MOS transistor Q9. As a result, the amount of current flowing to the MOS transistor Q8 is larger than the amount of current flowing to the MOS transistor Q7, and the flip-flop circuit FF is inverted. Due to this, the potential of the other end N2 changes from Vcc to GND, and the output voltage Vout also changes from Vcc to GND. In other words, the power-on reset pulse is output after the power-supply voltage Vcc reaches more than a predetermined voltage.

As mentioned above, in the circuit structure of FIG. 8, the power-on reset pulse is output after the power-supply voltage Vcc reaches more than a predetermined voltage regardless of the rise speed of the power-supply voltage Vcc.

However, the circuit structure of FIG. 8 has various problems. First, in the above conventional circuit, there is a problem in which the current continues flowing from the power-supply Vcc to the ground potential GND through the MOS transistor Q8 and the resistor element R3 in the normal state. In other words, in the normal state, the voltage, which corresponds to the threshold voltage of the MOS transistor Q9, is applied to the gate of the MOS transistor Q8. Due to this, if the power-supply voltage is more than the threshold voltage, the MOS transistor Q8 is always conductive, and the current flows through the MOS transistor Q8 and the resistor element R3. Therefore, it is difficult to reduce consumption power of the semiconductor device.

Second, in the conventional circuit, a large number of circuit elements including the resistor elements and the capacitor elements are needed. Due to this, there occurs a problem in which an occupation area of the circuit elements on a chip area is increased. Though the resistor element comprises a diffusion layer or polysilicon wiring, the chip area is largely occupied by the resistor elements.

SUMMARY OF THE INVENTION

An object of the present invention is to provide a power-on reset circuit in which a pulse signal can be output regardless of a speed rise of power-supply voltage after the power-supply voltage exceeds a predetermined voltage, consumption power is small in a normal state, and an occupation area is small.

The object of the present invention can be achieved by the following structure.

More specifically, according to the present invention, there is provided a power-on reset circuit comprising a first inverter circuit, connected between a power-supply and a ground, having an input terminal and an output terminal; a second inverter circuit, connected between the power-supply and the ground, having an input terminal and an output terminal, the input terminal of the second inverter circuit is connected to the output terminal of the first inverter circuit; a first capacitor element connected between the output terminal of the second inverter circuit and the power supply; a second capacitor element connected between the output terminal of the first inverter circuit and the ground; a third capacitor element connected between the output terminal of the second inverter circuit and the input of the first inverter circuit; and a fourth capacitor element connected between the input terminal of the first inverter circuit and the ground, wherein when an output voltage of the first inverter circuit is in a low level state at time of the rise of the power supply and a charging voltage of the third capacitor element reaches a predetermined voltage, the output voltage is set to be a high level to charge the second capacitor element, and when an output voltage of the second inverter circuit rises in accordance with the power-supply voltage, and the charged voltage of the second capacitor element reaches a predetermined voltage, the output voltage of the second inverter circuit is set to be a low level.

In other words, inversion timing of the first inverter circuit is controlled by a capacitance ratio of the first to fourth capacitor elements. After the inversion of the first inverter circuit, inversion timing of the second inverter circuit is controlled by the charging voltage of the second capacitor element. Thereby, even if the power-supply voltage rapidly or slowly rises, the power-on reset pulse can be generated. Moreover, in the normal state, since one of MOS transistors of the first and second inverter circuits is non-conductive, no through path from the power-supply to the ground is formed. Therefore, power consumption is extremely low. Moreover, since the number of circuit elements is small, the occupation area of the circuit elements on the chip area can be reduced.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram showing a power-on reset circuit of a first embodiment of the present invention;

FIG. 2 is a waveform view explaining an operation of the first embodiment of the present invention;

FIG. 3 is a waveform view explaining an operation of the first embodiment of the present invention;

FIG. 7 is a circuit diagram showing a third embodiment of the present invention.

DETAILED DESCRIPTION OF THE PREFERRED EMBODIMENTS

Figure 4:
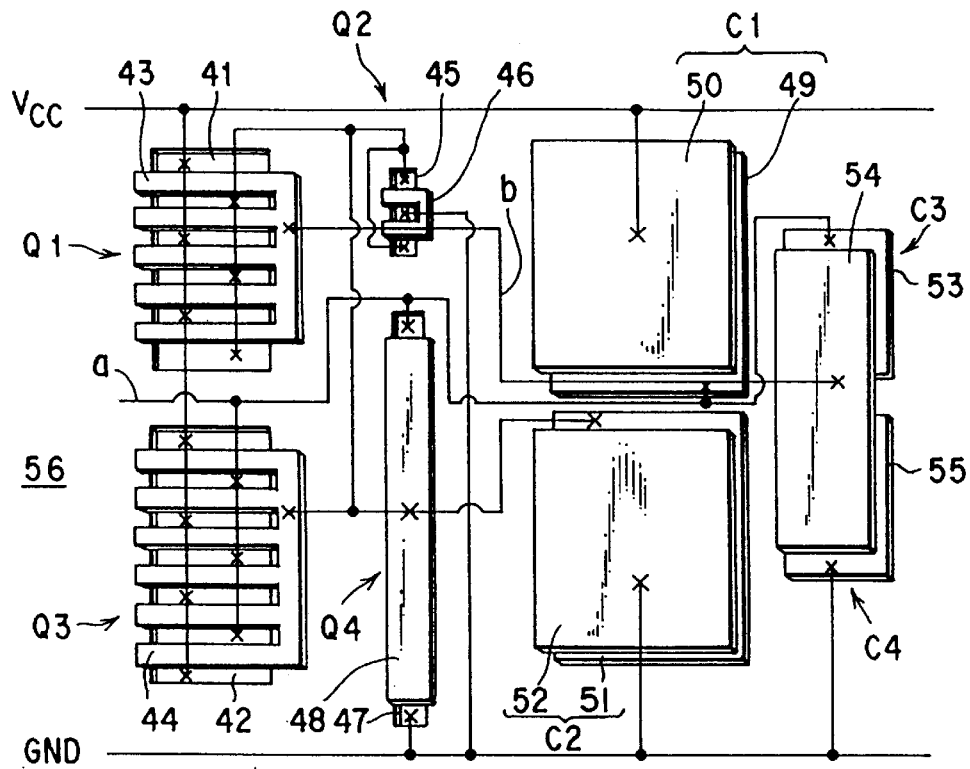
FIG. 4 is a plane view showing the arrangement of circuit elements.

Embodiments of the present invention will be explained with reference to the drawings. FIGS. 1 to 4 show a first embodiment of the present invention.

In a power-on reset circuit of FIG. 1, an inverter circuit 1 comprises a P channel MOS transistor Q1 and an N channel MOS transistor Q2 whose current paths are connected between a power-supply Vcc and a ground GND so as to be connected in series. An inverter circuit 2 comprises a P channel MOS transistor Q3 and an N channel MOS transistor Q4, whose current paths are connected between the power-supply Vcc and the ground GND so as to be connected in series. Gates of the MOS transistors Q3 and Q4 forming the inverter circuit 2 are connected to an output node Nc of the inverter circuit 1, that is, a drain of the MOS transistors Q1 and Q2. A power-on reset pulse signal is output from an output node Na of the inverter circuit 2, that is, a drain of the MOS transistors Q3 and Q4. A capacitor element C1 is connected between the output node Na and the power-supply Vcc. A capacitor element C2 is connected between the output node Nc of the inverter circuit 1 and ground. Moreover, a capacitor element C3 is connected between the output node Na of the inverter circuit 2 and an input node Nb of the inverter circuit 1, that is, gates of the MOS transistors Q1 and Q2. A capacitor element C4 is connected between the input node Nb of the inverter circuit 1 and the ground.

The following will explain an operation of the power-on reset circuit of FIG. 1 with reference to FIG. 2.

FIG. 2 is a waveform of voltage of each of nodes Na, Nb, Nc when the power-supply voltage rapidly rises. If the power-supply voltage Vcc rapidly rises from 0V at time $t_{10}$, the potential of each of the nodes Na and Nb rises in a direction of the power-supply voltage Vcc in accordance with a capacitance ratio of capacitor elements C1, C3 and C4. At time $t_{11}$, if a potential difference, which corresponds to threshold voltage Vp of the MOS transistor Q1 measured from the power-supply voltage Vcc side, is generated between the power-supply voltage Vcc and the node Nb, the MOS transistor Q1 is made conductive, and charging of the capacitor element C2 is started. As a result, the potential of the node Nc gradually rises. In many cases, the voltage Vp corresponds to the threshold voltage of the MOS transistor Q1. However, the voltage Vp slightly varies in connection with driving ability of the MOS transistor Q2. At time $t_{12}$, if the potential of the node Nc rises up to voltage Vthn, which corresponds to the threshold voltage of the MOS transistor Q4, the MOS transistor Q4 is made conductive, and the potential of the node Na falls. In this way, the voltage of the node Na increases in accordance with the rise of the power-supply voltage Vcc. Then, in a state that the power-supply voltage Vcc is set to a normal value, the voltage of the node Na falls, and the pulse signal Vout is generated.

FIG. 3 shows a voltage waveform of each of nodes Na, Nb, and Nc when the power-supply voltage Vcc slowly rises. In this case, a time axis unit of FIG. 3 is set to a different value from the case of FIG. 2, and FIG. 3 shows a longer passage of time than the case of FIG. 2. At time $t_{20}$, the power-supply voltage Vcc slowly rises from 0V. In the power-on reset circuit of FIG. 1, if a sub-threshold current, that is, voltage, which is less than the threshold voltage, is applied between the gate and source, the amount of current flowing to the MOS transistor Q3 is set to be larger than the amount of current flowing to the MOS transistor Q4. The sub-threshold current varies by the gate voltage. Due to this, more specifically, when the voltage between the gate and the drain is close to 0V or the power-supply voltage is close to 0V, the amount of current flowing between the source and the drain of the transistor Q3 is set to be larger than that of the transistor Q4. The above setting is performed by suitably adjusting the threshold voltage of each of the MOS transistors Q3 and Q4 and the gate width and the gate length. As a result, at time $t_{20}$ and after, the potential of the node Na is the same as the power voltage Vcc. Also, the potential of the node Nb is set in accordance with the capacitance ratio of the capacitor elements C3 and C4. Then, the potential of the node Nb increases in accordance with the rise of the power-supply voltage Vcc.

In the inverter circuit 1, contrary to the inverter circuit 2, the amount of the sub-threshold current of the MOS transistor Q1 is set to be smaller than that of the MOS transistor Q2. More specifically, when the voltage between the gate and the drain is close to 0V or the power-supply voltage is close to 0V, the amount of current flowing between the source and the drain of the transistor Q1 is set to be smaller than that of the transistor Q2. The above setting is performed by suitably adjusting the threshold voltage of each of the MOS transistors Q1 and Q2 and the gate width and the gate length. As a result, at time $t_{20}$ and after, the potential of the node Nc is the same as the ground potential. Thereafter, at time $t_{21}$, if a potential difference is generated between the potential of the node Nb and the power-supply voltage Vcc, the output of the inverter circuit 1 is inverted, and the node Nc is charged by the MOS transistor Q1. As a result, the inverter circuit 2 is inverted, and the potential of the node Na falls to the ground potential. Similarly, the potential of the node Nb falls to the ground potential. Since this falling operation is a positive feedback operation, the operation is completed at high speed. In this way, the above-structured power-on reset circuit can generate the pulse signal Vout to the node Na in accordance with the rise of the power-supply voltage Vcc.

According to the above-mentioned embodiment, the pulse signal can be surely output in the case where the power-supply voltage rapidly rises and slowly rises. The above explained the two extreme cases in which the power-supply voltage rises extremely rapidly and the power-supply voltage rises extremely slowly. However, in many cases, the actual operation is performed in an intermediate state between the above two extreme cases. Also, even in a case where the power-supply voltage falls in the course of the rise of the voltage, the correct power-on reset pulse can be output.

Moreover, as is obvious from FIG. 1, in the power-on reset circuit of the present invention, which is in the normal state, the current does not flow to the ground from the power source excepting the sub-threshold current, which slightly flows to the inverter circuit. As a result, the number of the circuit elements of the power-on reset circuit of the present invention is smaller than that of the conventional circuit, and the occupation area of the circuit elements on a chip area is reduced since the resistor elements, which occupy the large area of the chip, are not used.

FIG. 4 is a plane view showing the circuit of FIG. 1. In this figure, the same reference numerals as FIG. 1 are added to the portions common to FIG. 1.

FIG. 4 shows a field region 56 excepting substrate regions 41, 42, 45, and 47. This semiconductor device uses two-layer polysilicon. The MOS transistor Q3 comprises the N type substrate region 42 and a gate 44 formed of a first polysilicon layer, and the MOS transistor Q4 comprises the P type substrate region 47 and a gate 48 formed of the first polysilicon layer. The MOS transistor Q1 comprises the N type substrate region 41 and the gate 43 formed of the first polysilicon layer, and the MOS transistor Q2 comprises the P type substrate region 45 and a gate 46 formed of the first polysilicon layer. The capacitor element C1 comprises an electrode 49, formed of the first polysilicon layer, and an electrode 50 formed of a second polysilicon layer, and the capacitor element C2 comprises an electrode 51, formed of the first polysilicon layer, and an electrode 52 formed of the second polysilicon layer. Moreover, the capacitor element C3 comprises an electrode 53, formed of the first polysilicon layer, and an electrode 54 formed of the second polysilicon layer, and the capacitor element C4 comprises an electrode 55, formed of the first polysilicon layer, and the electrode 54 formed of the second polysilicon layer. These elements are connected to each other by metal wire such as aluminum. In FIG. 4, an insulation film, which is formed between the electrodes of the respective capacitor elements, is omitted.

As mentioned above, the capacitor elements C1 to C4 are formed of the first and second polysilicon layers, and the electrode connected to the inverter circuit is not formed of the diffusion layer of the substrate. Due to this, no junction leak current is generated. As a result, even in a case where the power-supply voltage rises extremely slowly, the power-on reset pulse can be surely output.

The following will show the specific size of each of the MOS transistors and that of each of the capacitor elements. A film thickness of an effective insulation film of each of the capacitor elements C1 to C4 is 10 nm, and a film thickness of a gate oxide film of each of the capacitor elements C1 to C4 is 20 nm. An area of the capacitor element C1 is 3260 $\mu m^2$, an area of the capacitor element C2 is 5260 $\mu m^2$, an area of the capacitor element C3 is 1950 $\mu m^2$, and an area of the capacitor element C4 is 3300 $\mu m^2$. A gate width/gate length (W/L) of the MOS transistor Q3 is 500/90 $\mu m$, a W/L of the MOS transistor Q4 is 3.2/100 $\mu m$, a W/L of the MOS transistor Q1 is 300/2.4 $\mu m$, and a W/L of the MOS transistor Q2 is 10/2.4 $\mu m$.

In the above first embodiment, all electrodes of the capacitor elements C1 to C4 were formed on the field region by use of polysilicon. However, the present invention is not limited to the above case. Among the capacitor elements C1 to C4, only the electrodes, which are connected to the input terminal of the inverter circuit can be formed on the field region by use of polysilicon, and the other electrodes, which are not connected to the input terminal, may be formed in the substrate by use of the diffusion layer.

Figure 5:
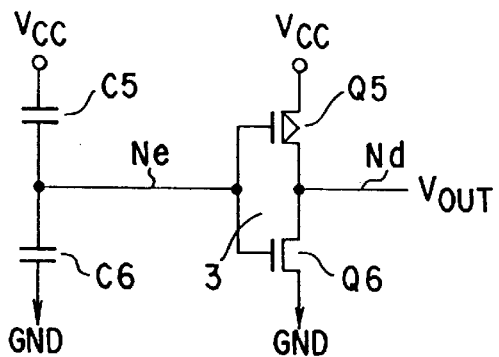
FIG. 5 is a circuit diagram showing a second embodiment of the present invention.

FIG. 5 shows a second embodiment of the present invention. In the second embodiment, an inverter circuit 3 comprises a P channel MOS transistor Q5 and an N channel MOS transistor Q6 whose current paths are connected between the power-supply Vcc and the ground GND so as to be connected in series. A capacitor element C5 is connected between an input node Ne of the inverter circuit 3 and the power-supply Vcc, and a capacitor element C6 is connected between the input node Ne and the ground. The power-on reset pulse signal Vout is output from the output node Nd of the inverter circuit 3. The capacitor elements C5 and C6 are formed on the field region. In other words, regarding the electrodes of the capacitor elements C5 and C6, the electrodes, which are connected to the gates of the MOS transistors Q5 and Q6, are not formed by the diffusion layer of the semiconductor substrate. Therefore, no leak path is formed between the respective capacitor elements C5 and C6 and the semiconductor substrate.

Figure 6:
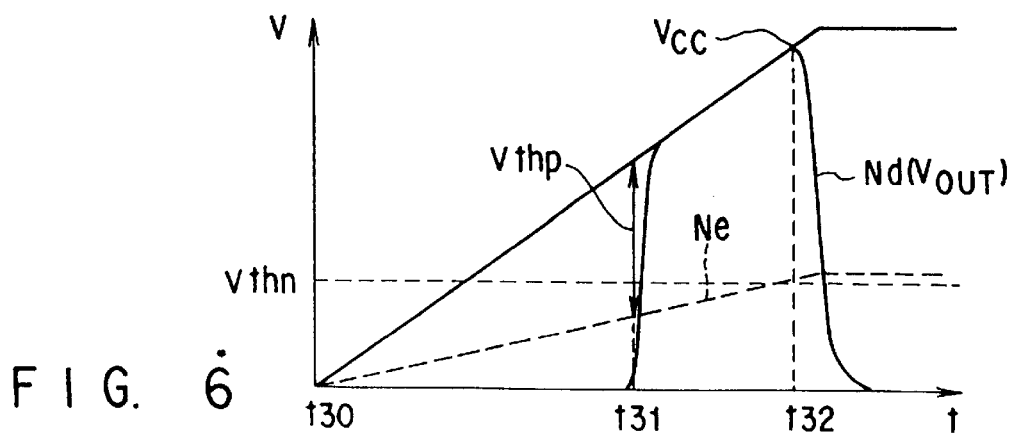
FIG. 6 is a waveform view explaining an operation of the second embodiment of the present invention.
Figure 8:
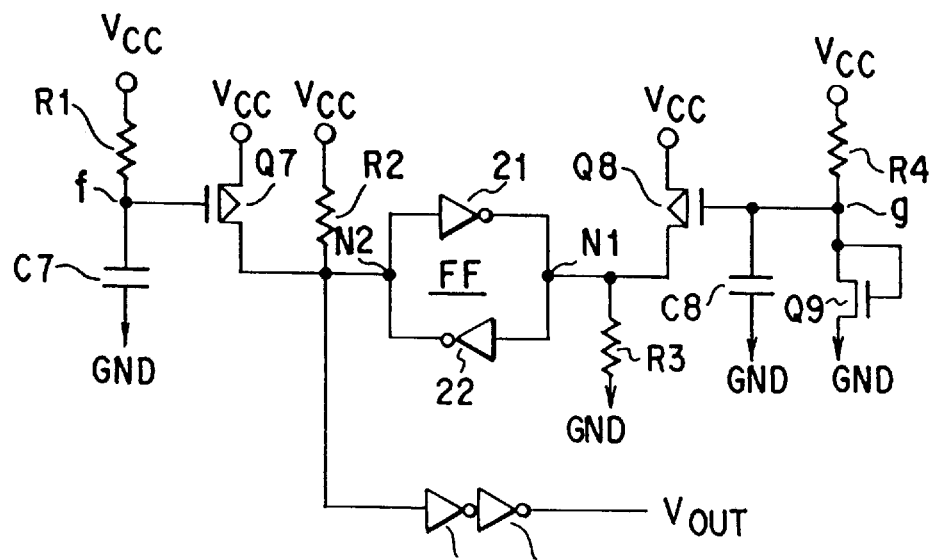
FIG. 8 is a circuit diagram showing a conventional power-on reset circuit.

The following will explain an operation of the power-on reset circuit of FIG. 5 with reference to FIG. 6.

FIG. 6 is a waveform of voltage of each of nodes Ne and Nd when the power-supply voltage slowly rises. If the power-supply voltage Vcc slowly rises from 0V at time $t_{30}$, the potential of the node Ne rises in accordance with a ratio of capacitances of the capacitor elements C5 and C6. In the power-on reset circuit of FIG. 5, the amount of the sub-threshold current flowing to the MOS transistor Q6 is set to be larger than the amount of the sub-threshold current flowing to the MOS transistor Q5. The sub-threshold current varies by the gate voltage. Due to this, more specifically, when the voltage between the gate and the drain is close to 0V or the power-supply voltage is close to 0V, the amount of current flowing between the source and the drain of the transistor Q6 is set to be larger than that of the transistor Q5. The above setting is performed by suitably adjusting the threshold voltage of each of the MOS transistors Q5 and Q6 and the gate width and the gate length. As a result, at time $t_{30}$ to time $t_{31}$, the potential of the node Nd is the same as the ground potential. At time $t_{31}$, if a potential difference Vthp, which corresponds to the threshold voltage of the MOS transistor Q5, is generated between the potential of the node Ne and the power-supply voltage Vcc, the output of the inverter circuit 3 is inverted, and the node Nd is charged by the MOS transistor Q5. The voltage of the node Nd rises in accordance with the power-supply voltage Vcc. At time $t_{32}$, if the potential of the node Ne rises up to voltage Vthn, which corresponds to the threshold voltage of the MOS transistor Q6, the MOS transistor Q6 is made conductive, and the potential of the node Nd falls through the MOS transistor Q6.

In the second embodiment, the power-on reset pulse signal Vout can be output in accordance with the rise of the power-supply voltage by suitably adjusting the gate width, the gate length, and the threshold voltage.

In the case of the second embodiment, when the power-supply voltage Vcc is in the normal state, voltage, which is more than Vthp, is generated between the power supply and the node Ne, and the potential of the node Ne is more than the threshold voltage Vthn of the MOS transistor Q6. Due to this, the MOS transistors Q5 and Q6 are made conductive, so that the current flows through the MOS transistors Q5 and Q6 in the normal time. However, in this embodiment, since the number of the circuit elements is smaller than the case of the first embodiment, the power-on reset circuit can be formed in the state that the occupation area of the circuit elements on the chip area is smaller than the case of the first embodiment.

FIG. 7 shows a third embodiment of the present invention. In this embodiment, the same reference numerals as the first embodiment are added to the portions common to the first embodiment, and only the different portions from the first embodiment will be explained.

In the circuit of the first embodiment, the input node Nb of the inverter circuit 1 is connected to the electrodes of the capacitor elements C3 and C4, and the input node Nb has no discharging path. Due to this, if the input node Nb is charged up by some reason in the course of the manufacture, the electric charge cannot be discharged. Therefore, the gate potentials of the MOS transistors Q1 and Q2 changes due to the electric charge, and an erroneous operation may be caused.

In order to prevent the above trouble, according to the third embodiment, a fuse element 71 is connected between the node Nb and the ground. If the electric charge is charged to the input node Nb by some reason in the course of the manufacture, the electric charge is discharged through the fuse element 71. The fuse element 71 is cut by use of, e.g., laser, after the manufacture of the semiconductor device. Therefore, since there is no extra charge on the input node Nb, the erroneous operation can be prevented.

The fuse element 71 can be also applied to the power-on reset circuit of FIG. 5.

In the third embodiment, the extra charge was removed by use of the fuse element 71. However, the present invention is not limited to the above case. For example, the node Nb maybe irradiated with ultraviolet rays after the manufacture, thereby making it possible to erase the charge charged on the node Nb without using the fuse element 71.

What is claimed is:

1. A power-on reset circuit comprising:
    a first inverter circuit having a first MOS transistor of a first conductivity type, a second MOS transistor of a second conductivity type, and input and output terminals, said first and second MOS transistors having current paths connected in series between a power-supply and a ground, a gate of each of said first and second transistors connected to said input terminal of said first inverter circuit, and a connection node of said current paths of said first and second MOS transistors connected to said output terminal of said first inverter circuit;
    a second inverter circuit having a third MOS transistor of the first conductivity type, a fourth MOS transistor of the second conductivity type, and input and output terminals, said third and fourth MOS transistors having current paths connected in series between said power-supply and said ground, a gate of each of said third and fourth transistors connected to said output terminal of said first inverter circuit, and a connection node of said current paths of said third and fourth MOS transistors connected to said output terminal of said second inverter circuit;
    a first capacitor element connected between said output terminal of said second inverter circuit and said power-supply;
    a second capacitor element connected between said output terminal of said first inverter circuit and said ground;
    a third capacitor element connected between said output terminal of said second inverter circuit and said input terminal of said first inverter circuit; and
    a fourth capacitor element connected between said input terminal of said first inverter circuit and said ground.

2. The circuit according to claim 1, wherein when an output voltage of said first inverter circuit is in a low level state at a time of a rise of a voltage of said power-supply and a charging voltage of said third capacitor element reaches a threshold voltage of said first MOS transistor, said first MOS transistor is made conductive, and the output voltage of said first inverter circuit is set to be a high level to charge said second capacitor element through said first MOS transistor, and wherein when said second capacitor element is charged through said first MOS transistor, and when an output voltage of said second inverter circuit rises in accordance with the voltage of said power-supply, and the charged voltage of said second capacitor element reaches a threshold voltage of said fourth MOS transistor, said fourth MOS transistor is made conductive, and the output voltage of said second inverter circuit is set to be a low level.

3. The circuit according to claim 1, wherein when a voltage between a source and said gate of each of said first to fourth MOS transistors is close to 0V, an amount of current flowing between said source and a drain of said third MOS transistor is set to be larger than an amount of current flowing between said source and a drain of said fourth MOS transistor, and an amount of current flowing between said source and a drain of said first MOS transistor is set to be smaller than an amount of current flowing between said source and a drain of said second MOS transistor, and a capacitance ratio between said third capacitor element and said fourth capacitor element is set such that a voltage applied to said gate of said second MOS transistor is higher than a threshold voltage of said second MOS transistor when a voltage of said power-supply is higher than a predetermined voltage.

4. The circuit according to claim 1, wherein when a voltage of said power-supply is close to 0V, an amount of current flowing between a source and a drain of said third MOS transistor is set to be larger than an amount of current flowing between a source and a drain of said fourth MOS transistor, and an amount of current flowing between a source and a drain of said first MOS transistor is set to be smaller than an amount of current flowing between a source and a drain of said second MOS transistor.

5. The circuit according to claim 1, further comprising:

a semiconductor substrate; and a field region formed in said semiconductor substrate, wherein said third and fourth capacitor elements are formed on said field region, and have no leak path to said semiconductor substrate.

6. The circuit according to claim 1, further comprising:

a fuse element connected between a connection point of said third and fourth capacitor elements and said ground.

7. The circuit according to claim 6, wherein said fuse element discharges an electric charge charged on said third and fourth capacitor elements in the course of the manufacture of said circuit, and is cut after the manufacture of said circuit.

8. The circuit according to claim 1, further comprising:

a semiconductor substrate, said semiconductor substrate having a field region formed thereon, and said first to fourth capacitor elements have electrodes, respectively, and only the electrodes of said capacitor elements which are connected to said input terminal of said first inverter circuit are formed on said field region.

9. A power-on reset circuit comprising:

an inverter circuit including a first MOS transistor of a first conductivity type and a second MOS transistor of a second conductivity type having current paths connected in series between a power-supply and a ground, a gate of each of said first and second transistors connected to an input terminal of said inverter circuit, and a connection node of said current paths of said first and second MOS transistors connected to an output terminal of said inverter circuit;

a first capacitor element connected between said power-supply and said input terminal of said inverter circuit; and a second capacitor element connected between said ground and said input terminal of said inverter circuit, wherein when a voltage of said power-supply is close to 0V, an amount of current flowing between a source and a drain of said first MOS transistor is set to be smaller than an amount of current flowing between a source and a drain of said second MOS transistor, and a capacitance ratio between said first capacitor element and said second capacitor element is set such that a voltage applied to said gate of said second MOS transistor is higher than a threshold voltage of said second MOS transistor when the voltage of said power-supply is higher than a predetermined voltage.

10. The circuit according to claim 9, further comprising:

a semiconductor substrate, wherein said first and second capacitor elements are insulated from said semiconductor substrate.

11. The circuit according to claim 9, wherein an output voltage of said inverter circuit is said ground when a voltage of said input terminal of said inverter circuit is at a first level, and the output voltage of said inverter circuit is the voltage of said power-supply when the voltage of said input terminal of said inverter circuit is at a second level higher than the first level, and the output voltage of said inverter circuit is said ground when the voltage of said input terminal of said inverter circuit is at a third level higher than the second level.

12. The circuit according to claim 9, wherein a sub-threshold current of said first MOS transistor is set to be smaller than a sub-threshold current of said second MOS transistor.

13. The circuit according to claim 9, wherein said first and second capacitor elements are formed on a field region.

14. A power-on reset circuit comprising:

a first inverter circuit having a first MOS transistor of a first conductivity type formed in a semiconductor substrate, and a second MOS transistor of a second conductivity type, said first and second MOS transistors having current paths connected in series between a power-supply and a ground, a gate of each of said first and second transistors connected to an input terminal of said first inverter circuit, and a connection node of said current paths of said first and second MOS transistors connected to an output terminal of said first inverter circuit;

a second inverter circuit having a third MOS transistor of the first conductivity type formed in said semiconductor substrate, a fourth MOS transistor of the second conductivity type, said third and fourth MOS transistors having current paths connected in series between said power-supply and said ground, a gate of each of said third and fourth transistors connected to said output terminal of said first inverter circuit, and a connection node of said current paths of said third and fourth MOS transistors connected to an output terminal of said second inverter circuit;

a field region formed on said semiconductor substrate; and first to fourth capacitor elements formed on said field region;

wherein said first capacitor element is connected between said output terminal of said second inverter circuit and said power-supply, said second capacitor element is connected between said output terminal of said first inverter circuit and said ground, said third capacitor element is connected between said output terminal of said second inverter circuit and said input terminal of said first inverter circuit, and said fourth capacitor element is connected between said input terminal of said first inverter circuit and said ground.

15. The circuit according to claim 14, wherein when an output voltage of said first inverter circuit is in a low level state at a time of a rise of a voltage of said power-supply and a charging voltage of said third capacitor element reaches a threshold voltage of said first MOS transistor, said first MOS transistor is made conductive, and the output voltage of said first inverter circuit is set to be a high level to charge said second capacitor element through said first MOS transistor, and wherein when said second capacitor element is charged through said first MOS transistor, and when an output voltage of said second inverter circuit rises in accordance with the voltage of said power-supply, and the charged voltage of said second capacitor element reaches a threshold voltage of said fourth MOS transistor, said fourth MOS transistor is made conductive, and the output voltage of said second inverter circuit is set to be a low level.

16. The circuit according to claim 14, wherein when a voltage between a source and said gate of each of said first to fourth MOS transistors is close to 0V, an amount of current flowing between said source and a drain of said third MOS transistor is set to be larger than an amount of current flowing between said source and a drain of said fourth MOS transistor, and an amount of current flowing between said source and a drain of said first MOS transistor is set to be smaller than an amount of current flowing between said source and a drain of said second MOS transistor, and a capacitance ratio between said third capacitor element and said fourth capacitor element is set such that a voltage applied to said gate of said second MOS transistor is higher than a threshold voltage of said second MOS transistor when a voltage of said power-supply is higher than a predetermined voltage.

17. The circuit according to claim 14, wherein when a voltage of said power-supply is close to 0V, an amount of current flowing between a source and a drain of said third MOS transistor is set to be larger than an amount of current flowing between a source and a drain of said fourth MOS transistor, and an amount of current flowing between a source and a drain of said first MOS transistor is set to be smaller than an amount of current flowing between a source and a drain of said second MOS transistor.

18. The circuit according to claim 14, further comprising:
   a fuse element connected between a connection point of said third and fourth capacitor elements and said ground.

19. The circuit according to claim 18, wherein said fuse element discharges an electric charge charged on said third and fourth capacitor elements in the course of the manufacture of said circuit, and is cut after the manufacture of said circuit.

20. A power-on reset circuit comprising:
   a first inverter circuit, connected between a power-supply and a ground, having an input terminal and an output terminal;
   a second inverter circuit, connected between said power-supply and said ground, having an input terminal and an output terminal, said input terminal of said second inverter circuit being connected to said output terminal of said first inverter circuit;
   a first capacitor element connected between said output terminal of said second inverter circuit and said power-supply;
   a second capacitor element connected between said output terminal of said first inverter circuit and said ground;
   a third capacitor element connected between said output terminal of said second inverter circuit and said input terminal of said first inverter circuit; and
   a fourth capacitor element connected between said input terminal of said first inverter circuit and said ground;
   wherein when an output voltage of said first inverter circuit is in a low level state at a time of a rise of a voltage of said power-supply and a charging voltage of said third capacitor element reaches a first predetermined voltage, the output voltage of said first inverter circuit is set to be a high level to charge said second capacitor element, and when an output voltage of said second inverter circuit rises in accordance with the voltage of said power-supply, and the charged voltage of said second capacitor element reaches a second predetermined voltage, the output voltage of said second inverter circuit is set to be a low level.

21. The circuit according to claim 20, wherein said first inverter circuit includes a first MOS transistor and a second MOS transistor, said first and second MOS transistors have current paths connected in series between said power-supply and said ground, said second inverter circuit includes a third MOS transistor and a fourth MOS transistor, said third and fourth MOS transistors have current paths connected in series between said power-supply and said ground, the output voltage of said first inverter circuit is in the low level state at the time of the rise of the voltage of said power-supply, when the charging voltage of said third capacitor element reaches the first predetermined voltage which is a threshold voltage of said first MOS transistor, said first MOS transistor is made conductive, and the output voltage of said first inverter circuit is set to be the high level, when said second capacitor element is charged through said first MOS transistor, the output voltage of said second inverter circuit rises in accordance with the voltage of said power-supply, and the charged voltage of said second capacitor element reaches the second predetermined voltage which is a threshold voltage of said fourth MOS transistor, said fourth MOS transistor is made conductive, and the output voltage of said second inverter circuit is set to be the low level.

22. The circuit according to claim 20, wherein said first inverter circuit includes a first MOS transistor and a second MOS transistor, said first and second MOS transistors have current paths connected in series between said power-supply and said ground, said second inverter circuit includes a third MOS transistor and a fourth MOS transistor, said third and fourth MOS transistors have current paths connected in series between said power-supply and said ground, when a voltage between a source and a gate of each of said first to fourth MOS transistors is close to 0V, an amount of current flowing between said source and a drain of said third MOS transistor is set to be larger than an amount of current flowing between said source and a drain of said fourth MOS transistor, and an amount of current flowing between said source and a drain of said first MOS transistor is set to be smaller than an amount of current flowing between said source and a drain of said second MOS transistor, and a capacitance ratio between said third capacitor element and said fourth capacitor element is set such that a voltage supplied to said gate of said second MOS transistor is higher than a threshold voltage of said second MOS transistor when the voltage of said power-supply is higher than a predetermined voltage.

23. The circuit according to claim 20, wherein said first inverter circuit includes a first MOS transistor and a second MOS transistor, said first and second MOS transistors have current paths connected in series between said power-supply and said ground, said second inverter circuit includes a third MOS transistor and a fourth MOS transistor, said third and fourth MOS transistors have current paths connected in series between said power-supply and said ground, and when a voltage of said power-supply is close to 0V, an amount of current flowing between a source and a drain of said third MOS transistor is set to be larger than an amount of current flowing between a source and a drain of said fourth MOS transistor, and an amount of current flowing between a source and a drain of said first MOS transistor is set to be smaller than an amount of current flowing between a source and a drain of said second MOS transistor.

24. The circuit according to claim 21, wherein said third and fourth capacitor elements are formed on a field region insulated from a semiconductor substrate, and said third and fourth capacitor elements have no leak path to said semiconductor substrate.

25. The circuit according to claim 20, further comprising:
   a semiconductor substrate,
   said semiconductor substrate having a field region formed thereon, and said first to fourth capacitor elements have electrodes, respectively, and only the electrodes of said capacitor elements which are connected to said input terminal of said first inverter circuit are formed on said field region.

* * * * *

UNITED STATES PATENT AND TRADEMARK OFFICE
CERTIFICATE OF CORRECTION

PATENT NO.: 5,812,001

DATED: September 22, 1998

INVENTOR(S): Keniti IMAMIYA

It is certified that an error appears in the above-identified patent and that said Letters Patent is hereby corrected as shown below:

Column 12, line 22, claim 22, after "ground," insert --and--.

Signed and Sealed this

Twenty-ninth Day of December, 1998

*Attest:*

BRUCE LEHMAN

*Attesting Officer*     *Commissioner of Patents and Trademarks*